United States Patent [19]
Manstretta et al.

[11] Patent Number: 6,028,793
[45] Date of Patent: Feb. 22, 2000

[54] HIGH VOLTAGE DRIVER CIRCUIT FOR A DECODING CIRCUIT IN MULTILEVEL NON-VOLATILE MEMORY DEVICES

[75] Inventors: Alessandro Manstretta, Broni; Andrea Pierin, Graffignana; Guido Torelli, Alessio con Vialone, all of Italy

[73] Assignee: STMicroelectronics S.r.l., Agrate Brianza, Italy

[21] Appl. No.: 09/224,330

[22] Filed: Dec. 31, 1998

[30] Foreign Application Priority Data

Dec. 31, 1997 [EP] European Pat. Off. ............. 97830738

[51] Int. Cl.[7] .................................................. G11C 16/06
[52] U.S. Cl. ................................ 365/185.23; 365/189.11; 365/230.06
[58] Field of Search ........................ 365/185.23, 189.09, 365/189.11, 230.06

[56] References Cited

U.S. PATENT DOCUMENTS

| | | | |
|---|---|---|---|
| 5,490,119 | 2/1996 | Sakurai et al. ................. | 365/230.06 |
| 5,633,832 | 5/1997 | Patel et al. ..................... | 365/230.06 |
| 5,636,175 | 6/1997 | McLaury ........................ | 365/230.06 |
| 5,696,721 | 12/1997 | McAdams et al. ............. | 365/189.11 |
| 5,717,650 | 2/1998 | Chung et al. ................... | 365/230.06 |
| 5,777,926 | 7/1998 | Trinh et al. ..................... | 365/185.19 |
| 5,936,910 | 8/1999 | Hashimoto ...................... | 365/230.06 |

*Primary Examiner*—Son T. Dinh
*Attorney, Agent, or Firm*—Theodore E. Galanthay; David V. Carlson; Seed & Berry LLP

[57] ABSTRACT

The invention relates to a driving circuit for row decoding which is also useful in non-volatile memory devices of the multi-level Flash type and the multi-level EPROM type and allows the overall capacitive loads as seen from the program voltage generator and the read/verify voltage generator, to be drastically reduced without involving segmentation of the decoding circuit.

18 Claims, 5 Drawing Sheets

HIGH VOLTAGE DRIVER CIRCUIT FOR A DECODING CIRCUIT IN MULTILEVEL NON-VOLATILE MEMORY DEVICES

TECHNICAL FIELD

This invention relates to electrically programmable non-volatile memory devices, particularly devices of the multi-level type.

BACKGROUND OF THE INVENTION

As is well known, today's technology allows so-called multi-level memory cells, that is memory cells whose threshold voltage can be programmed at any of several predetermined levels, to be produced.

EPROM, EEPROM, and Flash cells can be programmed by fine control of the charge injected into the floating gate so as to provide devices having different threshold voltages.

A non-volatile memory cell programmable at $m=2^n$ threshold levels can store n bits. A non-volatile memory cell having four threshold voltages, for example, can store two bits, and a cell with sixteen different threshold values can store up to four bits.

Thus, for a given silicon area (the memory cell matrix, or array, forming a major portion of a non-volatile memory), a device comprising multi-level memory cells would contain, in the above examples, two or four times as much information as is contained in devices comprising conventional cells, i.e., two-level cells.

A most promising technique for programming multi-level non-volatile memory cells is known as the PV (Program & Verify) technique, which is also employed with two-level non-volatile memory cells and Flash memories, e.g., for soft-programming "erratic" bits.

This technique consists of applying suitable voltages to the terminals of a memory cell during its programming, and subsequently reading its information contents during the verification ("verify") phase.

The verify operation consists of reading the state of the cell (e.g., the current flowing through the cell under predetermined bias conditions, or the voltage developed thereby on a suitable load), and subsequently comparing it with a suitable reference known as the "PV" reference.

The selected cell is programmed by applying successive program pulses to both the control gate and drain terminals of the memory cell. The analog voltage applied to the gate terminal of the cell is generated internally by a dedicated circuit.

The program gate voltage (referred to as Vpr hereinafter) could be different from the program supply voltage Vpp, set to 12 V during the program and verify operation.

The appropriate voltages are applied to the word-lines through the driving stages of the corresponding row decoding circuit.

In a memory architecture of the NOR EPROM type, all the drivers have the supply voltage terminal in common, since no segmenting (i.e., no organizing of the memory into sectors) is provided. Therefore, the capacitive load, as seen from that node, is found to be quite significant where multi-megabit memories are involved, which makes current solutions for applying the program voltage generated internally in the memory chip impracticable due to the long switching time required for the transitions between "program" and "verify" phases.

Since multi-level memories require a large number of program pulses, it is necessary for these switching times to be the shortest possible.

FIG. 1 shows a conventional row decoding architecture as commonly employed in a number of standard non-volatile memory devices. An address entered from the outside is decoded using a tree structure, so as to minimize the number of inputs to the internal logic gates and optimize the so-called decoding structure pitch to match the pitch of the matrix cells.

Some so-called pre-encode signals are generated to decode the desired word line, which are then utilized as select inputs to a final row selector (second-level decoding). The general decoding circuit comprises a low-voltage logic (being supplied Vdd) and a word line (Vpc) driver for the application of appropriate voltages to the selected word line, and the appropriate non-selection of "unselected" rows. Of course, the specific structure of a decoding network would be dependent on the type of the memory device architecture. For example, with logic NOR architectures, the selected word line would be set to a predetermined voltage according to the operation to be executed, typically to a suitable high voltage Vpr in the programming phase and to a suitable lower voltage during the read and verify phases (for example, to the supply voltage Vdd (3 or 5 V) in the read mode).

The unselected rows are disabled by the application of a low voltage, typically a ground potential, to the respective word-lines. The function of the row driver is to transfer the required voltage to the corresponding word line, according to the address selected and the operational phase. FIG. 2 shows the typical structure of a row driver as currently employed in memory architectures of the NOR type. The driver consists of an inverter which is supplied a voltage Vpc and has an input IN connected to the output of a selection logic whose logic levels are 0 V for L (Low), and Vdd=3 or 5 V for H (High).

A pull-up PMOS transistor M1 is connected between IN and Vpc. If the corresponding row is selected (IN=L or 0 V), the output OUT goes to the value of the voltage Vpc. In this case, the transistor M1 would be 'on' and a sinking of static power would occur. In fact, there is a current flowing, between Vpc and ground via M1, through the pull-down branch of the second decoding stage.

If the row is not selected (IN=H, i.e., no conductive path is provided between IN and ground through the pull-down branch of the second decoding stage), OUT is at 0 V. To provide an output OUT=0 V, transistor M2 must be turned off completely and transistor M3 turned on, these transistors forming parts of the circuit shown in FIG. 2. For this reason the pull-up transistor M1 is arranged to ensure, by its suitably selected resistive value, that the voltage IN will follow the voltage Vpc, and that OUT is 0 V.

With CMOS technologies of the dual metal level type, on the other hand, the driver structure may be as shown diagramatically in FIG. 3, wherein the gate terminal of M1 is connected to the output OUT directly. This expedient, besides ensuring full operation for the structure, allows the sinking of static power typical of the first structure when IN=L, and therefore OUT=H, to be eliminated. The first structure is useful essentially with single metal level technologies, where restrictions on the layout (in particular, compliance with the pitch of the memory array) make connecting the gate of M1 to the output OUT very difficult or even impossible.

In either case, the driver structure involves the use of a single voltage supply Vpc for both the inverter and M1. In a multi-level or "multi-megabit" memory, the capacitive load as seen from that node would be too high, especially where no organization into sectors of the memory architecture is provided, for example, for a 4 Mcells memory comprising 4096 rows and not organized into sectors, the overall load would be approximately 800 pF with conventional fabrication technology, when all the parasitic contributions are taken into account.

This value is of minor importance in the instance of standard two-level memories, wherein no fast switching between the program and verify phases is required, because the number of PV operations, and consequently the number of PV switchings, is small. However, this value would hinder the use of the circuit structures shown in multi-level memories which are programmed by the application of several pulses of the program voltage to the gate terminal of a selected cell. In this case, fast switching between the application phase of the high program voltage and the verification phase becomes necessary in order to keep the overall cell programming time within limits.

For example, the required switching time may be on the order of 100 ns where each program/verify pulse duration is about 1 µs. These capacitance and time values require particular performance of both the program voltage generator and the internal read voltage generator. In fact, a dynamic current of approximately 50 mA would be needed for proper charging/discharging of the node Vpc during program/verify switchings.

A possible solution to the problem could be that of segmenting the memory array and the decoding circuitry. For example, a selector could be connected between the supply terminals of the final stages (i.e., of the drive stages of the decoding circuitry) and the voltage supply line. The driving stages are grouped into different groups, where all the driving stages of the same group have the respective supply terminal short-circuited and are therefore supplied through the same selector. In operation, only the selector corresponding to the selected driving stage is activated, and therefore only the driving stages in the selected group constitute a real capacitive load for the supply voltage Vpc. On the one side, this possibility would reduce the overall load as seen from Vpc, but this would be obtained at the expense of increased complexity for the decoding circuit, with its attendant disadvantages (increased complexity of decoding management, increased area occupation, etc.). This solution, moreover, would be applicable to Flash memories, which are organized into sectors, but not to EPROMs, whose architectures are not organized into sectors by definition.

SUMMARY OF THE INVENTION

An embodiment of this invention provides a driving circuit for row decoding which can be used in non-volatile memory devices of the multi-level Flash type and of the multi-level EPROM type, and affords a drastic reduction in the overall load as seen from the program voltage generator and the read/verify voltage generator, without the decoding having to be segmented.

The features and advantages of a circuit according to the invention will be apparent from the following description of an embodiment thereof, given by way of non-limitative example with reference to the accompanying drawings.

DETAILED DESCRIPTION

An embodiment of this invention provides a decoding driver structure for multi-megabit memories which is effective to reduce the overall capacitive load connected to the power supply terminal of the driver. This structure is useful especially with multi-level non-volatile memories, such as EPROMs, wherein the on-chip programming is carried out by applying a suitable voltage to the selected word line. This invention makes the specifications for the program voltage generator simpler while retaining the operability of the row driver in the read mode and avoiding segmentation of the decoding circuit architecture. However, the invention may also be applied to conventional two-level memories, whether of the EPROM or the Flash type.

Figure 4:
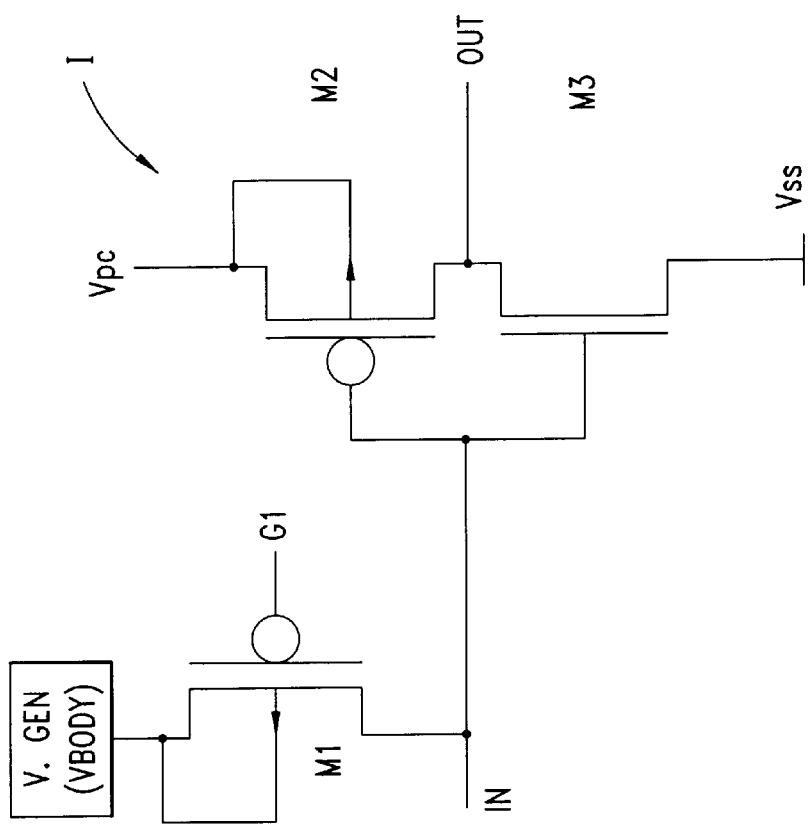
FIGS. 4 and 5 show corresponding circuits according to the invention, being useful with multi-level non-volatile memory devices.
Figure 5:
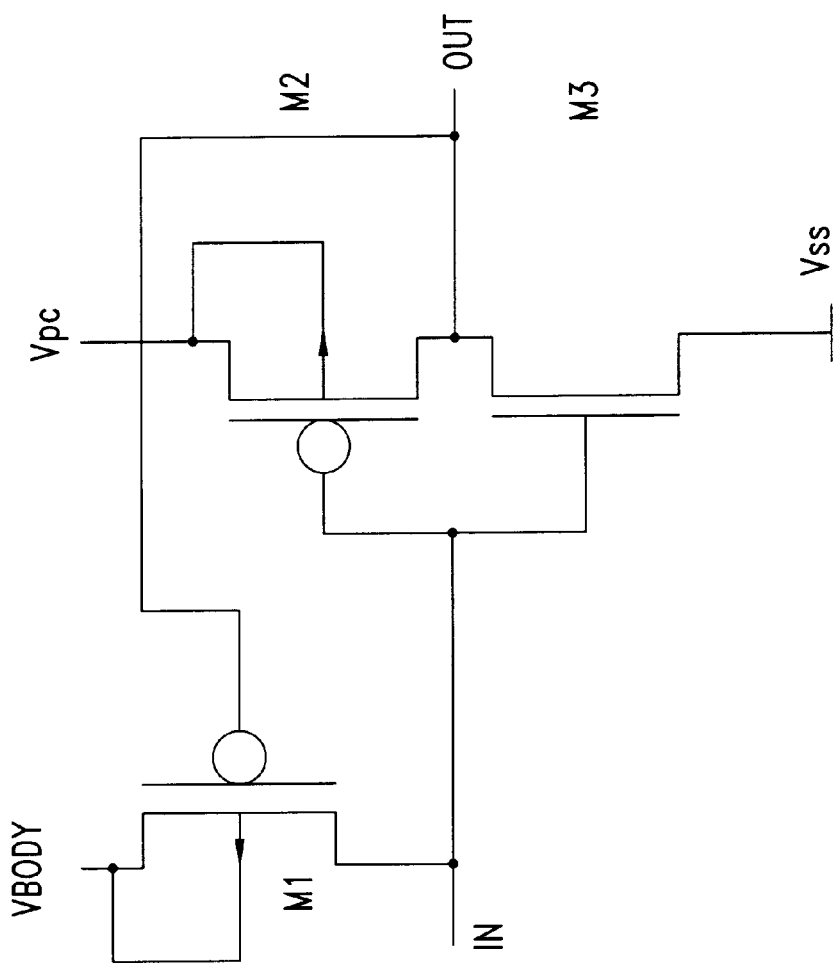

FIGS. 4 and 5 show respective circuit diagrams of row drivers according to the invention which are particularly suited to be integrated with single metallization level and double metallization level technologies, respectively. The row driver of FIG. 4 includes a PMOS transistor M1 having a source terminal connected to a first drive voltage VBODY, a gate terminal connected to a bias voltage generator G1, a drain terminal connected to an input terminal IN of the row driver, and a body terminal connected to the source terminal. The row driver also includes an inverter I coupled between the input terminal IN and an output terminal OUT. The inverter I includes a PMOS transistor M2 and an NMOS transistor M3 coupled between a second drive voltage Vpc and a reference voltage Vss, which could be a ground or a negative voltage. The PMOS transistor M2 has a source terminal connected to the second drive voltage Vpc, a gate terminal connected to the input terminal IN, a drain terminal connected to the output terminal OUT, and a body terminal connected to the source terminal. The NMOS transistor M3 has a source terminal connected to the reference voltage Vss, a gate terminal connected to the input terminal IN, and a drain terminal connected to the output terminal OUT. The embodiment shown in FIG. 5 is identical to that shown in FIG. 4 except that the output terminal OUT is connected to the gate terminal of the PMOS transistor M1.

Figure 1:
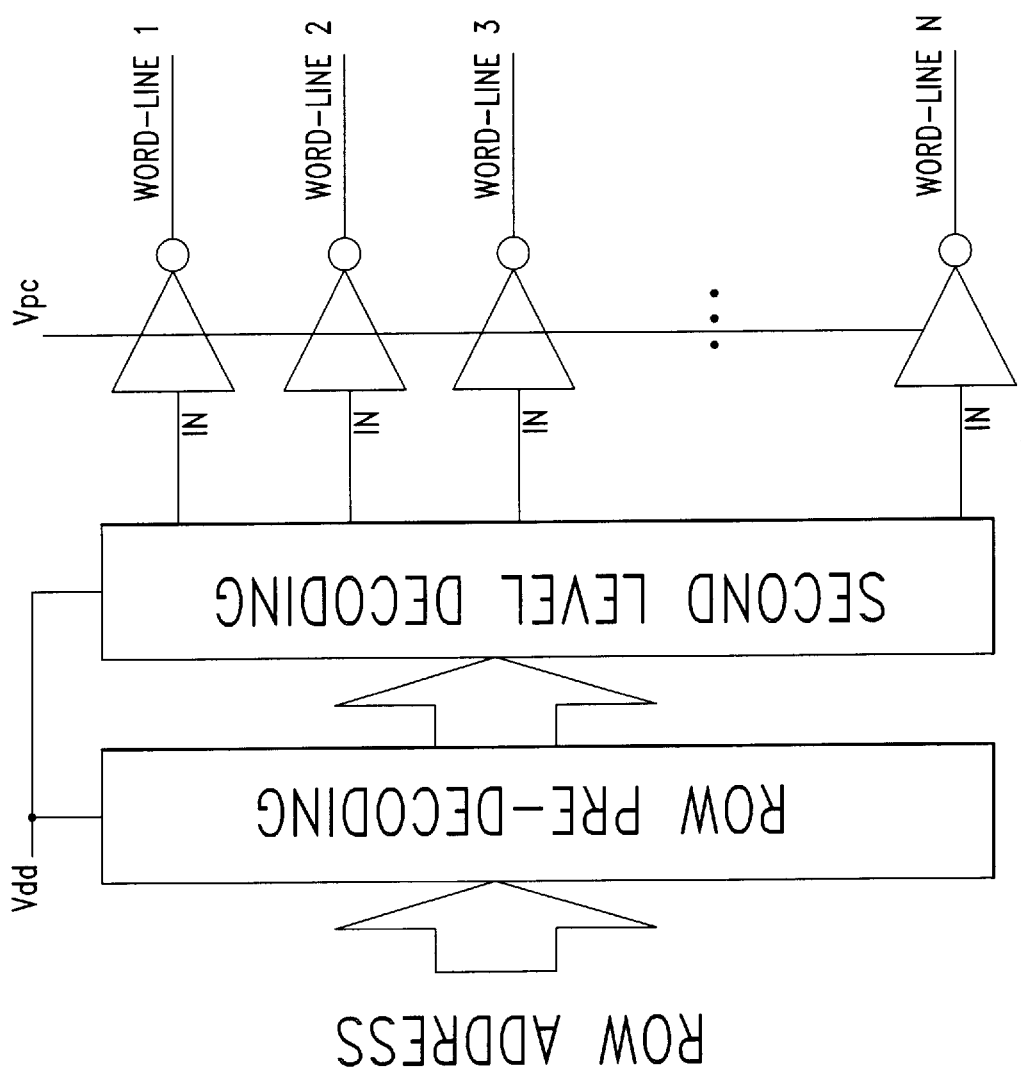
FIG. 1 shows a conventional architecture for row decoding in non-volatile memory devices.
Figure 2:
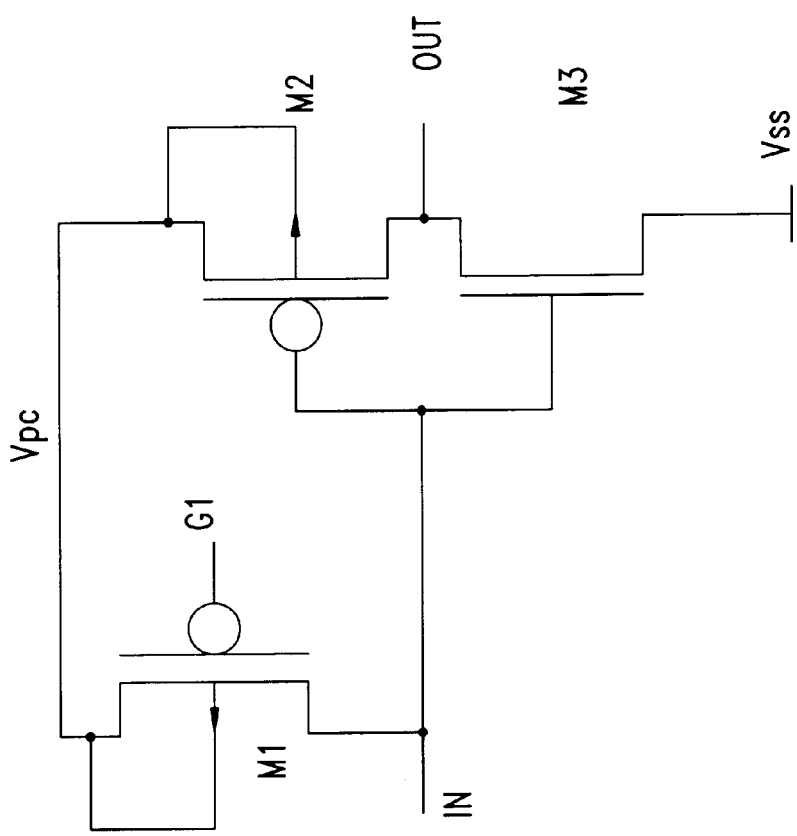
FIGS. 2 and 3 show conventional drive circuits for row decoding in non-volatile memory devices.
Figure 3:
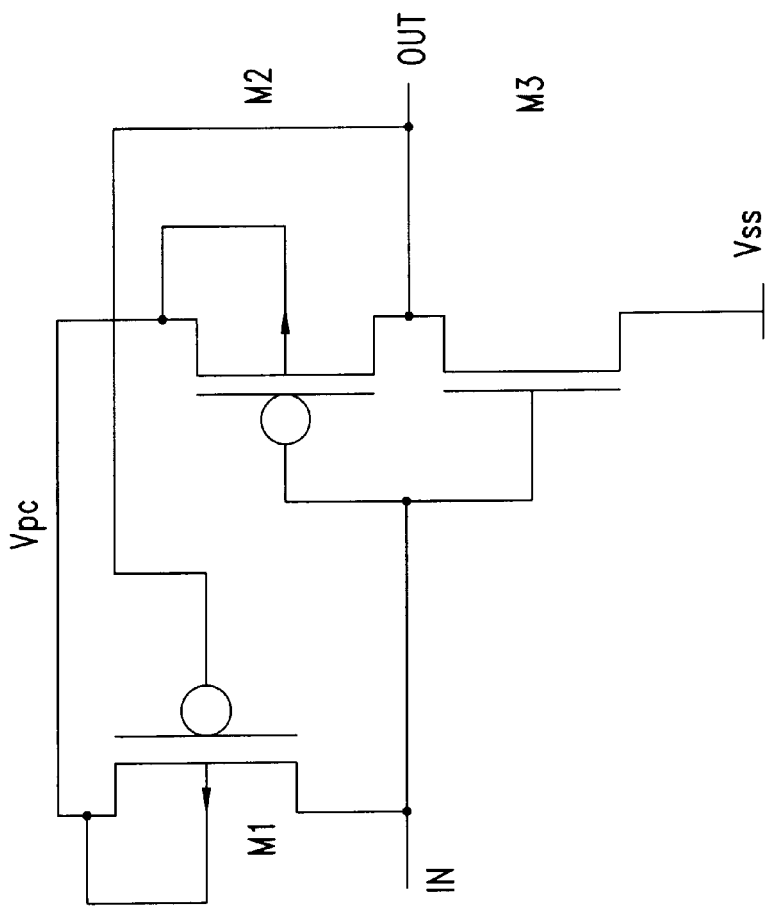

Unlike the conventional circuit diagrams of FIGS. 2 and 3, the voltage supplies to the transistor M1 and the inverter according to the embodiments of FIGS. 4 and 5 are separate.

The source of M1 is connected to a suitable voltage, referred to as VBODY in FIGS. 4 and 5. The VBODY line is separate from the Vpc line.

For a non-selected word line (IN=H, OUT=L), we have M1 being "on" in the triode region, M2 is "off" and M3 is "on" in the triode region. Therefore we have:

$$C_{pc} = C_{well2} + C_{gs2,off} \quad (1a)$$

where $C_{well2}$ is the well capacitance of M2 and $C_{gs2,off}$ is the gate-to-source capacitance of M2 in the "off" state, and $$C_{body} = C_{well1} + C_{gs1} + C_{gd1,on} + C_{IN} + C_{par} \quad (1b)$$

where $C_{well1}$ is the well capacitance of M1, $C_{gs1,on}$, $C_{gd1,on}$ are the gate-to-source and the gate-to-drain capacitances of M1 in the "on" state, respectively; $C_{IN}$ is the overall capacitance as seen from the node IN, including the gate capacitance $C_{gs}$ of the transistors connected to the node (i.e., M2 and M3); and $C_{par}$ is the capacitance of the interconnects to the node IN.

For a selected word line (IN=L, OUT=H), we have that M1 is either "on" or "off" depending on the voltage applied to the node G1 (e.g., M1 is "on" in the saturation region if VG1=0 V, and is "off" if G1 is connected to the node OUT, and hence VG1=Vpc) M2 is "on" in the triode region and M3 is "off". Therefore we have:

$$C_{pc} = C_{well2} + C_{gs2,on} + C_{gd2,on} + C_{d3} + C_{OUT} \quad (2a)$$

where $C_{gs2,on}$ and $C_{gd2,on}$ are the gate-to-source and the gate-to-drain capacitances of M2 in the "on" state, respectively; $C_{d3}$ is the drain capacitance of M3; and $C_{OUT}$ is the capacitance of the node OUT, including the capacitance of the selected word line and $$C_{body} = C_{well1} + C_{gs1} \quad (2b)$$

where $C_{gs1}$ is the gate-to-source capacitance of M1 in the considered state.

In a memory having N word-lines and M bit-lines, only one word-line is selected at a time, while the other N−1 are non-selected. Therefore, the total capacitive load seen by Vpc, $C_{pcTOT}$, consists of the contributions of N−1 terms equal to (1a) and one contribution equal to (2a). The same way, the total capacitive load seen by VBODY, $C_{bodyTOT}$, consists of the contributions of N−1 terms equal to (1b) and one contribution equal to (2b).

In a memory with a large N, the contribution given by the N−1 terms generally dominates, For example, in a 16-Mcell EPROM memory with a NOR architecture where N=M= 4096, with a 0.6 μm technology, using typical driver dimensions typical capacitive values can be:

$$C_{pcTOT} = 4095 * C_{pc} \approx 200 \text{ pF} \quad (3a)$$

$$C_{bodyTOT} = 4095 * C_{body} \approx 600 \text{ pF} \quad (3b)$$

With the proposed solution, the total capacitive load ($C_{pcTOT} + C_{bodyTOT}$) is split into two parts, and the term $C_{bodyTOT}$ does not load Vpc. With the above values, the capacitive load seen by Vpc is approximately 200 pF. By contrast, in the conventional structure shown in FIGS. 2 and 3, the total capacitance ($C_{pcTOT} + C_{bodyTOT}$) would be the capacitive load of the single node Vpc, which therefore sees approximately 800 pF. As discussed below, the bias at node VBODY only varies during the mode transitions (program mode to read mode and vice-versa), where very fast switching of bias voltage is not required. On the contrary, very fast switching times are required of Vpc at each program/verify switching within a complete programming cycle (where a programming cycle is made up of a series of verifying and programming pulses), and therefore the reduction in the capacitive load seen by Vpc is advantageous.

Shown in Table I are exemplary values of the voltages VBODY and Vpc generated during the different phases of the device operation.

TABLE 1

Bias conditions of a row driver according to an embodiment of the invention.

|  | VBODY | Vpc |
| --- | --- | --- |
| PROGRAM | Vpp = 12V | Vpr = 6–12V |
| VERIFY | Vpp = 12V | Vread = 6V |
| READ | Vread = 6V | Vread = 6V |

Table 1: Bias conditions of a row driver according to an embodiment of the invention.

The bias at the node VBODY only varies during the mode transition (from PROGRAM to READ, and vice versa), not during the program/verify switching within any given programming cycle (i.e., while remaining in the same PROGRAM mode operation). Since the mode switching is inherently slow (for example, switching time: a few hundreds μs), the capacitive load of 600 pF does not require large dynamic currents. The node Vpc must instead be charged/discharged at each program/verify switching by the generators of the voltages Vpr and Vread, with switching times which are three orders of magnitude below those required for the mode transition (switching time of about 100 ns).

During the read phase (READ MODE), the voltage VBODY is forced to Vpc=Vread. Accordingly, the reading conditions will be identical with those of the circuit in FIG. 3. With single metal level technologies, the gate terminal of M1 (G1) cannot be connected to the output OUT without a substantial increase in the decoder pitch, and hence, in silicon area occupation which would lead to a remarkable increase in the cost of the chip. The transistor M1 should be suitably sized. In particular, the aspect ratio W/L of the transistor M1 should not be too large, in order to prevent excessive sinking for the selected line; W/L should not be too low, for speed reasons.

In summary, the circuit of this invention allows the overall capacitive load, as seen from the program gate voltage generator Vpr and the read/verify voltage generator Vread to be reduced during the program/verify sequence, thereby making for simpler generator specifications. During a Program and Verify sequence, it is very useful to have reduced switching times both for the programming pulses and for the verify (read) pulses. In addition, this circuit avoids the need to have the decoding circuitry and the memory cell array organized into sectors. This advantage is of special importance with EPROMs, for which organizing into sectors would be impractical. The use of a circuit structure according to the invention, in fact, eliminates the need for memory cell matrix techniques for organization into sectors, which would aggravate costs from increased occupation of silicon area.

The above-discussed embodiments allow, in particular, multi-level EPROMs to be implemented wherein the programming is effected by internal generation of a highly accurate analog voltage. This internal programming allows the overall programming time to be kept short compared to the external programming effected with conventional EPROM programmers.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A driving circuit for a row decoding circuit in a monolithically integrated non-volatile memory cell matrix memory device, having an input terminal for connection to the row decoding circuit and an output terminal for coupling to a selected word line of said memory cell matrix, comprising:
   a first field-effect transistor with a first type of conductivity and having first and second terminals, a control terminal which is connected to a bias voltage generator, and a body terminal which is connected to the first terminal, the second terminal of said first transistor being connected to the input terminal of the driving circuit;

second and third field-effect transistors whose conductivities are respectively the same as and the opposite to the conductivity of the first transistor, each having first and second terminals and a control terminal which is connected to the input terminal of the control circuit, the respective first terminals of the second and third transistors being connected respectively toe a first voltage reference and a second reference voltage and the respective second terminals of the second and third transistors being connected to each other, the second transistor having a body terminal connected to its own first terminal, wherein the first terminal of the first transistor is connected to a body bias line of the memory device.

2. A driving circuit according to claim 1, wherein the bias voltage generator is the output terminal of the driving circuit.

3. A non-volatile memory device of the multi-level type, wherein it includes a driving circuit according to claim 1.

4. The driving circuit of claim 1 wherein the bias voltage generator is a constant bias voltage generator.

5. The driving circuit of claim 1 wherein the bias voltage generator has a first value that is fixed during a first operating phase and a second value that is fixed during the second operating phase, the first value being different than the second value.

6. A high voltage driver circuit for a decoding circuit of a non-volatile memory comprising:

an input terminal coupled to the row decoding circuit;

an output terminal coupled to a selected word line of the memory;

an inverter having an input node coupled to the input terminal, an output node coupled to the output terminal, a first reference terminal coupled to a first driving voltage, and a second reference terminal coupled to a reference voltage; and a bias transistor having a control terminal, a first terminal coupled to the input terminal, and a second terminal coupled to a second driving voltage that is a fixed first value during a programming phase of the memory and is a fixed second value during a read phase of the memory.

7. The driving circuit of claim 6 wherein the control terminal of the bias transistor is coupled to a bias voltage generator that supplies the control terminal with a fixed bias voltage.

8. The driving circuit of claim 6 wherein the control terminal of the bias transistor is coupled to the output terminal.

9. The driving circuit of claim 6 wherein the inverter includes first and second inverter transistors, the first inverter transistor being of a first conductivity type and having a control terminal coupled to the input terminal, a first terminal coupled to the first driving voltage, and a second terminal coupled to the output terminal and the second inverter transistor being of a second conductivity type opposite to the first conductivity type and having a control terminal coupled to the input terminal, a first terminal coupled to the voltage reference, and a second terminal coupled to the output voltage.

10. The driving circuit of claim 9 wherein the bias transistor and the first inverter transistor are P-type transistors and the second inverter transistor is an N-type transistor.

11. The driving circuit of claim 6 wherein the bias transistor has a body terminal coupled to the first terminal.

12. The driving circuit of claim 6 wherein the control terminal is coupled to a bias voltage generator that provides at the control terminal a first voltage during the programming phase and a second voltage during the read phase.

13. A method of driving a selected word line of a non-volatile memory using a driving circuit having an inverter coupled between an input terminal and an output terminal, the inverter including a first inverter transistor having a control terminal coupled to the input terminal, a first terminal, and a second terminal coupled to the output terminal; and a bias transistor having a control terminal, a first terminal, and a second terminal coupled to the input terminal, the method comprising:

biasing the first terminal of the first inverter transistor from a first driving voltage source; and biasing the first terminal of the bias transistor from a second driving voltage source, the act of biasing the first terminal of the bias transistor including providing a first bias voltage during a programming phase of the memory and providing a second bias voltage during a read phase of the memory.

14. The method of claim 13, further comprising:

switching from the first bias voltage to the second bias voltage during a transition between the programming and read phases;

maintaining the first terminal of the bias transistor at the first bias voltage for the duration of the programming phase; and maintaining the first terminal of the bias transistor at the second bias voltage for the duration of the read phase.

15. The method of claim 13, further comprising:

biasing the control terminal of the bias transistor at a first voltage during the programming phase; and biasing the control terminal of the bias transistor at a second voltage during the read phase.

16. The method of claim 13, further comprising driving the control terminal of the bias transistor from the output terminal.

17. The method of claim 13, further comprising biasing the control terminal of the bias transistor and a fixed voltage.

18. The method of claim 13 wherein the inverter includes a second inverter transistor of opposite conductivity type from the first inverter transistor and the bias transistor, further comprising driving the output terminal to ground via the second inverter transistor when the input terminal is at a first voltage value.

* * * * *